United States Patent [19]

Tezaki et al.

[11] Patent Number: 4,990,218

[45] Date of Patent: Feb. 5, 1991

[54] METHOD OF TESTING CONDUCTOR FILM QUALITY

[75] Inventors: Atsumu Tezaki, Kawasaki; Katsuya Okumura, Yokohama, both of Japan

[73] Assignee: Kabushiki Kaisha Toshiba, Kawasaki, Japan

[21] Appl. No.: 336,800

[22] Filed: Apr. 12, 1989

[30] Foreign Application Priority Data

Sep. 26, 1988 [JP] Japan .................................. 63-240499

[51] Int. Cl.⁵ .................... B44C 1/22; C03C 15/00; C03C 25/06
[52] U.S. Cl. ..................................... 156/627; 156/630; 156/633; 156/643; 156/651; 156/653; 156/657; 156/659.1
[58] Field of Search ............... 156/626, 630, 627, 633, 156/643, 646, 651, 653, 657, 659.1, 661.1, 662; 204/192.12, 192.13, 192.17, 192.3, 192.32, 192.33, 192.35, 192.37; 427/38, 39

[56] References Cited
PUBLICATIONS

C. C. Hong, et al., "A New Technique for Monitoring Metallization Reliability at Wafer Level", IEEE/IRPS, 1985, pp. 108-114.

*Primary Examiner*—William A. Powell
*Attorney, Agent, or Firm*—Foley & Lardner, Schwartz, Jeffery, Schwaab, Mack, Blumenthal & Evans

[57] ABSTRACT

A method of testing the quality of a conductor film laminated onto a surface of a substrate, is carried out by the steps of mounting a testing stand having a T-shaped cross section on the surface of the substrate, the testing stand being provided with an undercut portion around the entire side periphery thereof, laminating a conductor film having a predetermined thickness on the surface of the substrate, and forming on the top surface of the testing stand a wiring pattern formed with a conductor film insulated from the first mentioned conductor film laminated onto the substrate. An electric current is then applied to the wiring pattern. A characteristic test of the conductor film can therefore be performed immediately after the laminating of the conductor film to significantly reduce the testing time.

7 Claims, 3 Drawing Sheets

METHOD OF TESTING CONDUCTOR FILM QUALITY

BACKGROUND OF THE INVENTION

This invention relates to a method of testing the film quality of a conductor film with reference to a semiconductor device, particularly for the purpose of remarkably shortening the testing time therefor.

A semiconductor device is generally provided with a conductor wiring or circuit that electrically connects active elements such as transistors, and the conductor wiring is generally made of an electrically conductive material such as aluminum or an aluminum alloy essentially consisting of aluminum so as to provide a low resistance. A pattern of the wiring made of the aluminum alloy, for instance, is worked into a predetermined form by laminating a conductor film made of an aluminum alloy, for instance, on a substrate by effecting a conventional evaporating or sputtering process.

The reliability of the wiring of the conductor film made of the aluminum alloy is, in one significant aspect, based on the migration of aluminum atoms due to heat or electric current. The migration due to the electric current is called electromigration causing faults due to interruption of wiring continuity during the operation of the semiconductor device. Due to electromigration, the lifetime of the wiring generally depends on the quality of the conductor film of the aluminum alloy, and the film quality of the conductor film generally depends on devices or conditions for laminating the conductor films. However, the film quality is liable to be damaged by, for example, contamination of the devices during the lamination period. It is therefore necessary to control and maintain the quality of the film in good condition through frequent testing.

One conventional method of testing the quality of the conductor film is a method in which the resistivity of the conductor film, the specular reflection ratio of the surface of the conductor film or the hardness thereof is measured. The film quality is then indirectly measured on the basis of the thus measured result.

Although, in the described conventional method, the measured values have certain relationships relative to the lifetime of the wiring because of electromigration, conventional methods provide a sensitivity and accuracy at least ten times worse when compared with a method such as described hereunder in which the lifetime is directly measured.

A method providing good sensitivity directly measures the lifetime of the wiring due to the electromigration. As an actual method of directly measuring the lifetime of the wiring due to the electromigration, there has been provided a method in which is prepared a wiring pattern, made of a conductor film such as aluminum alloy, comprising a substrate made of an insulating material such as silicon dioxide a pair of electrode units arranged on the surface of the substrate, and a wiring unit connecting the electrodes so as to allow electric current to flow therebetween, so that the time until the wiring unit is interrupted, is measured. In another method, the wiring pattern is composed of only the wiring unit including no electrode units, and an electric current flows from both ends of the wiring unit. In a further conventional method, the surface of the wiring unit is covered by a protecting film similar to the structure of an actual semiconductor device, and an electric current flows through exposed portions of both ends of the wiring unit.

Even in the case of a wiring pattern having a lifetime of ten years of actual usage, measuring tests will be carried out in the order of minutes in accordance with selected testing conditions, because the migration is accelerated by passing large electric currents under the high temperature.

However, even in the most simple structure, having merely a wiring unit, preparation of the wiring pattern only for the purpose of testing film quality of the conductor film, as described above with reference to the above-mentioned conventional methods, requires much time to prepare additional pieces of material for the purpose of preparing the intended material, laminating the conductor film such as aluminum on the surface of the material piece by the sputtering process or the like, and then carrying out resist coating, wiring pattern exposure and development, etching and resist removing processes. In addition, a further heat treatment process is required for stabilizing the crystallization. These processes may require a working time of about eight hours, for instance, until the results of the test are obtained.

For the reason described above, there is the possibility of developing a defective unit as a semiconductor device due to the defectiveness of the film quality of the conductor film. In the case where defective units have been developed, the production of the conductor film must be stopped for a long time. Moreover, there is a problem that the film quality at the time of actually producing the conductor film time may be slightly changed from the film quality at the testing time, where the wiring pattern is prepared only for the purpose of testing the film quality.

SUMMARY OF THE INVENTION

An object of this invention is to eliminate defects in the conventional technique described above and to provide a method of testing the quality of a conductor film in which characteristics testing for conductor film in the shape of conductor wiring of a semiconductor device, can be performed immediately after the lamination of the conductor film and therefore significantly reduce the testing time.

This and other objects of this invention can be achieved according to this invention by providing a method of testing the quality of a conductor film laminated onto a surface of a substrate, comprising the steps of disposing a substrate, mounting a testing stand having a substantially T-shaped cross section on the surface of the substrate and provided with an undercut portion around the entire side periphery of the testing stand, laminating a conductor film having a predetermined thickness on the surface of the substrate, forming on a top surface of the testing stand a wiring pattern formed with a conductor film electrically insulated from the first mentioned conductor film on the substrate, and applying an electric current to the wiring pattern.

In a preferred embodiment, the testing stand is prepared by the steps of laminating a silicon oxide film and a silicon nitride film on an upper surface of the substrate in laminating, forming a wiring pattern made of a resist on an upper surface of the laminated silicon nitride film, working said films so as to provide a wiring shape by an anisotropic etching process, removing the resist, and reducing the width of only the silicon oxide film by an isotropic etching process to form an undercut portion.

According to the method described above, since the conductor film is laminated, by the sputtering process for instance, on the surface of the substrate on which a testing stand is preliminarily formed, a wiring pattern is formed on the surface of the testing stand by the piled conductor film in a manner electrically insulated from the conductor film laminated on the surface of the substrate. The test of the quality of the conductor film such as the lifetime of the wiring due to electromigration can be carried out by passing electric current through the wiring pattern.

Accordingly, the time for obtaining the test results for the film quality can be remarkably reduced, whereby it is possible to substantially evaluate film quality in a testing time that occurs within actual production time.

The preferred embodiments of this invention will be described further in detail hereunder, with reference to the accompanying drawings.

DESCRIPTION OF THE PREFERRED EMBODIMENTS

Figure 2:
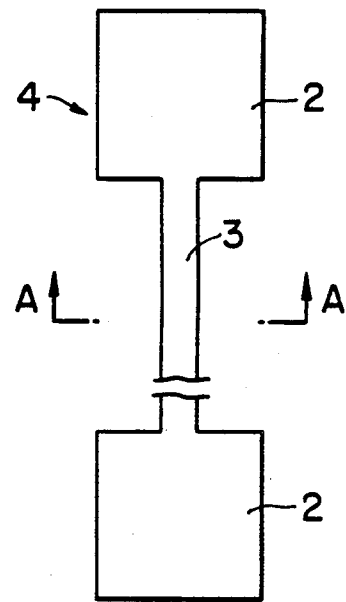
FIG. 2 shows the connection of electrode units and a wiring unit.
Figure 6:
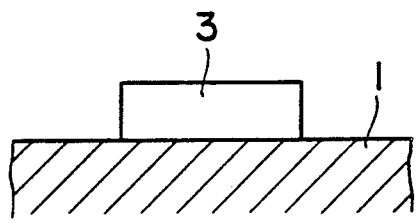
FIGS. 6 and 7 are sectional views of the manner of preparation of the wiring patterns according to the conventional technique.
Figure 7:
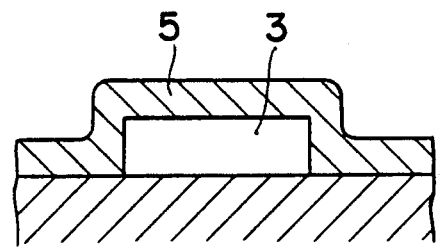

For a better understanding of this invention, the conventional technique in this field of art will be first described in conjunction with FIGS. 6 and 7 and FIG. 2.

According to the conventional technique, as shown in FIG. 6, a wiring unit 3 is disposed on the surface of a substrate 1 made of an insulating material such silicon dioxide, and a pair of electrode units 2, shown in FIG. 2, are also disposed on the surface of the substrate 1. Both of the electrode units 2 are connected through the wiring unit 3. A wiring pattern 4 composed of a conductor film of aluminum alloy, for example, is provided with the electrode units 2 and the wiring unit 3. An electric current passes between the electrode units 2, and the time until the wiring unit 3 is interrupted is measured. FIG. 7 shows a case in which the surface of the wiring unit 3 is covered by protecting film 5, similar to the actual structure of a semiconductor device. In this example, the electric current passes through the exposed portions of both the ends of the wiring unit 3. However, the described conventional technique involves many problems as described hereinbefore.

Figure 1:
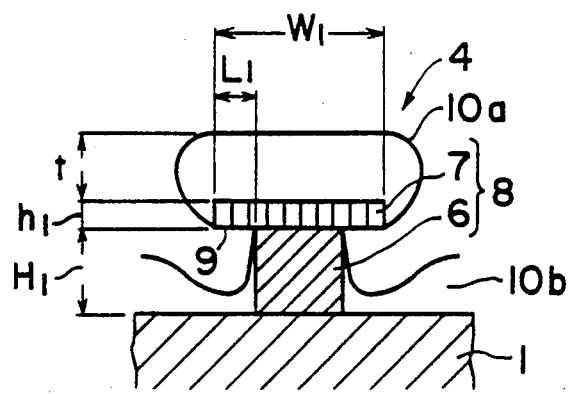
FIG. 1 is a cross sectional view of a wiring pattern according to the first embodiment of this invention.

FIGS. 1 to 3 represent the first embodiment according to this invention. Referring to FIGS. 1 and 2, a wiring pattern 4 made of a conductor film of aluminum alloy, for example, and composed of a pair of electrode units 2 and a wiring unit 3 connecting the electrode units 2 is formed on the surface of a substrate 1 made of an insulating material such as silicon dioxide. Based on the object of the test, the wiring unit 3 can be optionally formed in a linear shape, curved shape, bent shape, folded shape, or other shape in accordance with changes in the width and the length of the wiring. Each of the electrode units 2 is of a square shape having 100 μm as the length of one side, and acts to make contact with a probe and carry out wire bonding for the electrical connection to external equipment or elements.

FIG. 1 shows a sectional view of the wiring unit 3 described. Referring to FIG. 1, a testing stand or table 8 having T-shaped cross section stands on the surface of the substrate 1, the testing stand 8 comprises a leg portion 6 made of a silicon oxide film and a top flat portion 7 (hereinafter called merely a cap portion 7) having a width larger than that of the leg portion, made of a silicon nitride film. An undercut portion 9 is therefore formed between the leg portion 6 and the lower surface of the cap portion 7 around the leg portion 6 on the side surface of the testing stand 8.

Conductor films made of aluminum alloy are piled on the upper surfaces of the substrate 1 and the testing stand 8 respectively, for example, by the sputtering process. The conductor film 10a laminated onto the surface of the testing stand 8 is electrically separated from the conductor film 10b laminated onto the substrate 1 by the presence of the undercut portion 9, whereby a wiring pattern 4 electrically separated from the conductor film 10b can be prepared.

In an actual example, the testing stand was patterned with dimensions of the height $H_1$ of the silicon oxide film leg portion 6: 0.8 μm; the height $h_1$ of the silicon nitride film cap portion 7: 0.2 μm; the width $W_1$ of the wiring unit 3: 2 μm; and the length $L_1$ of the undercut portion 9: 0.5 μm. It was found that when an aluminum conductor film having a thickness of 0.8 μm was laminated by the sputtering process, the wiring pattern 4, i.e. the conductor film 10a in one sense, is electrically independent from the conductor film 10b laminated onto the substrate 1.

The sequential processes for preparing the testing stand 8 will be described with reference to FIGS. 3A to 3E.

Figure 3A:
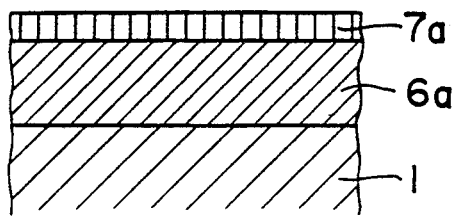
FIGS. 3A to 3E are sequential sectional views of one example of preparation of a testing stand.
Figure 3B:
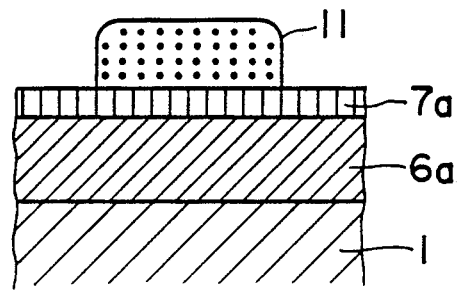
Figure 3C:
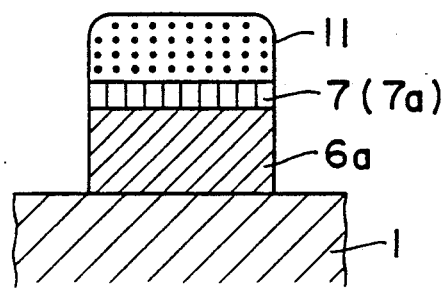
Figure 3D:
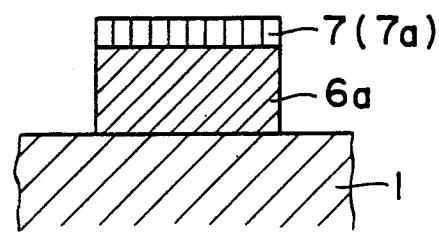
Figure 3E:
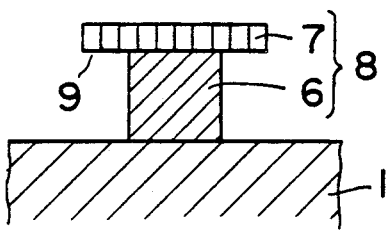

A silicon oxide film 6a and a silicon nitride film 7a are laminated onto the upper surface of the substrate as shown in FIG. 3A, and a wiring pattern made of the resist 11 is then formed on the upper surface of the laminated silicon nitride film 7a in accordance with a commonly known lithographing process as shown in FIG. 3B. Thereafter, the silicon oxide film 6a and the silicon nitride film 7a are worked so as to form the wiring shape of the resist 11 by the anisotropic etching process (RIE process) as shown in FIG. 3C, and the resist 11 is then removed, as shown in FIG. 3D. The width of only the silicon oxide film 6a is reduced by the isotropic etching process to form an undercut portion 9. The testing stand 8 provided with the leg portion 6, the cap portion 7 and the undercut portion 9 are thus prepared as shown in FIG. 3E.

In the described embodiment, the cap portion 7 may be formed by an insulating material other than silicon nitride film, and the leg portion 6 may also be formed by a material other than silicon oxide film, to which the isotropic etching process can be selectively effected. The etching of the leg portion 6 may or may not use the anisotropic etching process.

The quality of the conductor film 10a laminated onto the upper surface of the testing table 8, i.e. the quality of the conductor film 10b piled on the upper surface of the substrate 1 can be tested by passing electric current through the wiring unit 3 from both the electrode units 2 of the wiring pattern 4.

Figure 4:
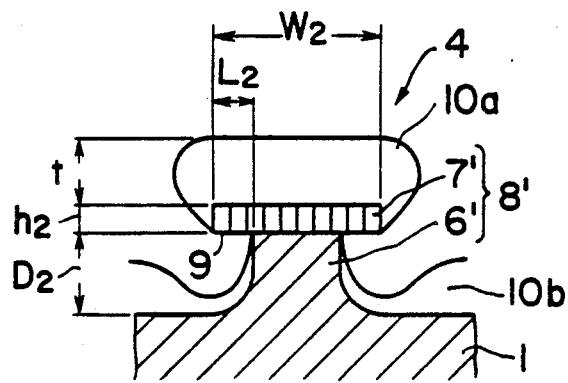
FIG. 4 is a view similar to that of FIG. 1, according to the second embodiment of this invention.

FIG. 4 shows a sectional view of the second embodiment according to this invention, in which a leg portion 6' is integrally formed with the same material as that of a silicon substrate 1', and a cap portion 7' made of the silicon oxide film is formed on the top surface of the leg portion 6' to prepare a testing stand 8'.

Figure 5A:
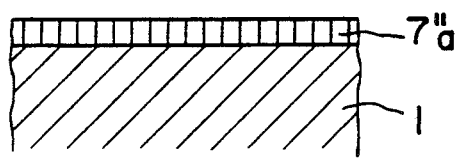
FIGS. 5A to 5E are sequential sectional views of another example of preparation of a testing stand.
Figure 5B:
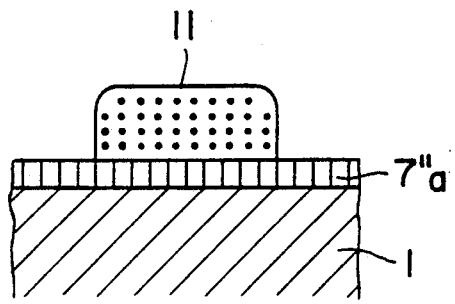
Figure 5C:
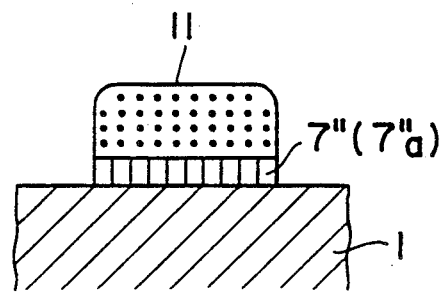
Figure 5D:
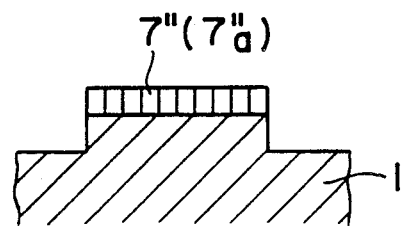
Figure 5E:
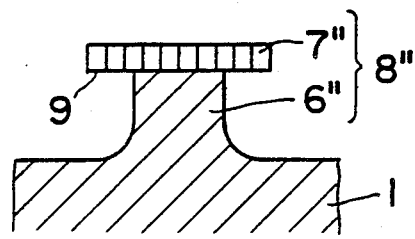

The embodiment shown in FIG. 4 is prepared by the manner as follows with reference to FIGS. 5A to 5E. That is, the silicon oxide film 7"a is laminated onto the upper surface of the silicon substrate 1 as shown in FIG. 5A and a wiring pattern of the resist 11 is formed in accordance with the usual lithographing process as shown in FIG. 5B. The silicon oxide film 7"a is etched to form the wiring pattern as shown in FIG. 5C and the silicon of the substrate 1 is subjected to the anisotropic etching process and peeling off the resist 11 as shown in FIG. 5D. Thereafter, the substrate 1 is subjected to the isotropic etching process to form the undercut portion 9, thus being formed as the testing stand 8", as shown in FIG. 5E.

A conductor film 10a made of such as aluminum alloy is laminated onto the upper surface of the testing stand 8" by the sputtering process, for example, in a manner electrically insulated from the conductor film 10b laminated onto the upper surface of the substrate 1 by the location of the undercut portion 9. Accordingly, the wiring pattern 4 electrically insulated from the conductor film 10b is formed by the conductor film 10a.

With the second embodiment directly described above, it was experimentally determined that the wiring pattern 4 (10a) was electrically insulated from the conductor film 10b on the substrate 1 when an aluminum film conductor having a thickness t of 0.8 μm was laminated onto the patterned testing stand 8" by the sputtering process when the height h₂ of the cap portion 7 of the silicon oxide film was 0.2 μm; the width W₂ of the wiring unit 3 was 2 μm; the depth D₂ of etching of the substrate 1 was 0.8 μm; and the length L₂ of the undercut portion 9 was 0.5 μm.

According to this second embodiment, the prepared wiring pattern provides a good heat conductivity, and passes a large amount of current.

The results of the tests of the lifetime due to the electromigration and carried out in accordance with the wiring patterns of the described first and second embodiments of this invention and the test of the conventional technique will be shown in the following table T.

In the tests carried out, an aluminum alloy film was utilized as the conductor film and the lamination of the conductor film was performed by the sputtering process. In that time, about 8 hours was required from the completion of the sputtering process to the start of the test in the conventional process for the resist coating, the pattern exposure and developing, the etching working, the resist coating processes, and the thermal treatment for the stabilization of the crystallization. On the contrary, according to the first and second embodiments of this invention, only the thermal treatment is required for stabilizing the crystallization to prepare a material having the same wiring structure as that prepared by the conventional process and having the crystallization substantially identical to that of the conventional process. Less than one hour was required for the thermal treatment according to the first and second embodiments of this invention.

TABLE T

| Material Preparation Method | | Conventional Example | First Embodiment | Second Embodiment |
|---|---|---|---|---|
| Number of Materials | | 10 | 10 | 10 |
| Currenting Type | | Probe type, currenting one by one | | |
| Current Density | | $1.5 \times 10^7$ A/cm² | $1.0 \times 10^7$ | $1.4 \times 10^7$ |
| Temperature of Wiring during Currenting | | | 300° C. | |
| Piling Condition (A) | Average Lifetime of Wiring | 2.5 min. | 4.9 min | 3.0 min. |
| | Required Time | 35 min. | 59 min. | 40 min. |
| Piling Condition (B) | Average Lifetime of Wiring | 0.90 min. | 1.2 min. | 0.98 min. |
| | Required Time | 19 min. | 22 min. | 20 min. |

Lamination Condition (A): Use of high purity argon gas as the sputtering gas
Lamination Condition (B): Use of low purity argon gas as the sputtering gas In these tests, high purity argon gas which is usually used, and low purity argon gas used for degrading the film quality, were used as sputtering gases, and the respective test results evaluated. Electric current was applied by contacting the probe to the upper surface of the electrode and a set of probes were utilized for sequentially testing a plurality of wiring patterns prepared on one substrate.

The wiring patterns are heated by self-heat generation during the current passing period and the temperature of the wiring patterns is regulated by the current density, so that the temperature was set to 300° C. in the tests and the current was accordingly regulated.

As can be shown from the above Table T, the current densities are different from each other in the respective test examples because of the difference in the heat radiation efficiency of the structure. That is, a relatively larger current can flow in the second embodiment in which the silicon having high heat conductive ratio is disposed, when compared with the first embodiment in which the silicon nitride film is disposed in the heat radiation path, and the current density of the second embodiment has a value similar to that of the conventional example.

The results regarding the electromigration lifetime correspond substantially to the current densities., and in comparison only with respect to the times required for the currenting tests, the conventional example required the shortest time and the first embodiment required the longest time. However, this time difference has no significant meaning, as described above, when compared with the difference in the material preparation time resulting from the use of the aluminum sputtering process. In addition, concerning the variation of the quality of the conductor film of aluminum, for example, the lowering of the lifetime was detected with respect to the respective examples.

As is described above, according to the embodiments of this invention, test results with substantially the same accuracy as that observed in the conventional example were obtained with a remarkably reduced working time.

What is claimed is:

1. A method of testing the quality of a conductor film laminated onto a surface of a substrate, comprising the steps of:

forming a test stand, having substantially a T-shaped cross section provided with an undercut portion around the entire periphery of said testing stand, on the surface of the substrate;

laminating a conductor film having a predetermined thickness on the surface of said substrate;

forming on a top surface of said testing stand a wiring pattern formed with said conductor film electrically insulated from said conductor film around said testing stand on said substrate; and applying an electric current to said wiring pattern, whereby characteristic testing of the conductor film can be performed immediately after the laminating of the conductor film, to significantly reduce the testing time.

2. A method according to claim 1, wherein said conductor film is formed by a sputtering process on the top surface of said testing stand.

3. A method according to claim 1, wherein the testing of the quality of the conductor film is carried out as to the lifetime thereof due to electromigration.

4. A method according to claim 1, wherein said conductor film on the substrate is electrically insulated from said conductor film on the testing stand by the undercut portion.

5. A method according to claim 1, wherein said testing stand is prepared by the steps of:

laminating a first material and a second material on an upper surface of said substrate, said first material being capable of undergoing a selected isotropic etching process with respect to said second material;

forming a wiring pattern made of a resist on an upper surface of the laminating second material;

finishing said first and second materials so as to provide a wiring shape by an anisotropic etching process;

removing the resist; and reducing the width of only the first material by an isotropic etching process, to form an undercut portion.

6. A method according to claim 5, wherein said first material is a silicon oxide film and said second material is a silicon nitride film.

7. A method according to claim 5, wherein said first material is the same material as said substrate.

* * * * *